United States Patent

Chen et al.

[11] Patent Number: 6,040,993
[45] Date of Patent: Mar. 21, 2000

[54] METHOD FOR PROGRAMMING AN ANALOG/MULTI-LEVEL FLASH EEPROM

[75] Inventors: Chia-Hsing Chen, I-Lan Hsian; Mam-Tsung Wang, Hsinchu, both of Taiwan

[73] Assignee: Macronix International Co., Ltd., Hsinchu, Taiwan

[21] Appl. No.: 09/028,229

[22] Filed: Feb. 23, 1998

[51] Int. Cl.[7] .................................................... G11C 7/00
[52] U.S. Cl. ............................... 365/185.03; 365/185.19; 365/185.22
[58] Field of Search ........................ 365/185.03, 185.19, 365/185.22, 185.24

[56] References Cited

U.S. PATENT DOCUMENTS

| | | | |
|---|---|---|---|
| 4,996,669 | 2/1991 | Kim et al. | 365/189.01 |
| 5,053,990 | 10/1991 | Kreifels et al. | 364/900 |
| 5,168,465 | 12/1992 | Harari | 257/320 |
| 5,198,380 | 3/1993 | Harari | 437/43 |
| 5,200,920 | 4/1993 | Norman et al. | 365/185 |
| 5,268,318 | 12/1993 | Harari | 437/43 |
| 5,268,870 | 12/1993 | Harari | 365/218 |
| 5,293,560 | 3/1994 | Harari | 365/185 |
| 5,299,162 | 3/1994 | Kim et al. | 365/201 |
| 5,434,825 | 7/1995 | Harari | 365/185 |
| 5,448,712 | 9/1995 | Kynett et al. | 395/430 |
| 5,497,119 | 3/1996 | Tedrow et al. | 327/540 |
| 5,509,134 | 4/1996 | Fandrich et al. | 395/430 |
| 5,513,333 | 4/1996 | Kynett et al. | 395/430 |
| 5,539,688 | 7/1996 | Yiu et al. | 365/185.14 |
| 5,546,042 | 8/1996 | Tedrow et al. | 327/538 |
| 5,548,554 | 8/1996 | Pascucci et al. | 365/200 |
| 5,550,772 | 8/1996 | Gill | 365/185.03 |

*Primary Examiner*—Vu A. Le
*Attorney, Agent, or Firm*—Mark A. Haynes; Haynes & Beffel LLP

[57] ABSTRACT

A method for programming an analog/multi-level flash memory array, which insures fast programming to substantially all of the cells in the array, without over-programming, is based on providing a pattern of program retry pulses which have respective pulse widths and pulse heights which vary according to a pattern. The pattern includes three stages which program and verify cell threshold voltages with different program verification margins so that an accurate cell threshold voltage can be achieved for each cell.

33 Claims, 7 Drawing Sheets

| Pulse Width | Pulse Height | Retry Number |
|---|---|---|
| 100 μs | 5.3 V/- 8.0 V | 1 |
| 100 μs | 5.7 V/- 8.0 V | 1 |
| 200 μs | 5.7 V/- 8.0 V | 1 |
| 200 μs | 6.3 V/- 8.0 V | 1 |
| 200 μs | 6.3 V/- 8.0 V | 1 |
| 800 μs | 6.3 V/- 8.0 V | 11 |

METHOD FOR PROGRAMMING AN ANALOG/MULTI-LEVEL FLASH EEPROM

BACKGROUND OF THE INVENTION

1. Field of the Invention

The present invention relates to flash electrically erasable programmable read only memories (EEPROM), and more particularly to methods for multi-level cell programming such memories.

2. Description of Related Art

One popular class of non-volatile semiconductor memory is the flash electrically erasable programmable read-only memory (Flash EEPROM). Flash EEPROM technology is based on a memory transistor which consists of a source, channel, and drain with a floating gate over the channel and a control gate isolated from the floating gate. In this type of memory cell data is stored by altering the amount of charge on the floating gate, which causes the threshold voltage $V_t$ of the memory cell to vary.

The floating gate can hold a range of charge and therefore an EEPROM memory cell can be programmed to any threshold level within a threshold range. The extent of the threshold range, bordered by the minimum and maximum threshold levels of the device, depends on the device's characteristics, operating conditions and history. Each distinct threshold level within the range may, in principle, be used to designate a definite memory state of the cell.

For two-level or two-state EEPROM memory, the transistor serving as a memory cell is programmed to one of two states by accelerating electrons from the substrate channel region, through a thin gate dielectric and onto the floating gate. The memory states are erasable by removing charge from its floating gate upon application of proper voltages. An array of such EEPROM cells is referred to as a "Flash" EEPROM array when an entire array of cells, or significant group of cells of the array, is erased simultaneously (i.e., in a flash). Once erased, a cell can then be re-programmed.

In the usual two-level EEPROM cell, one breakpoint threshold level is established so as to partition the threshold region into two regions. The source/drain current is compared with the breakpoint threshold level that was used when the cell was programmed. If the current read is higher than that of the threshold, the cell is determined to be in a "zero" state, while if the current is less than that of threshold, the cell is determined to be in the other state. Thus, such a two-level cell stores one bit of digital information.

Thus, for a multi-level/analog EEPROM memory cell, each cell stores two or more bits of data. The information that a given EEPROM array can store is thus increased by multiple of number of the states that each cell can store.

Increasing the number of bits that are stored in a single memory cell has several consequences with respect to programming the memory cell. First, the storage of multiple bits in a memory cell typically requires a narrow range of $V_t$ voltages for each state. Over-programming thus becomes a bigger concern, and care must be taken to precisely place the cell into the desired multi-level state. Second, the narrow ranges of threshold voltages $V_7$ for each state and need for accurate placement of states result in the values of the programming voltage levels being a critical parameter for accurately programming the memory cell. In other words, the programming verification margin must be tightened to a very small range.

EEPROM devices are typically set up as essentially orthogonal arrays of "bit lines" and "word lines" which can be programmably interconnected to achieve a desired logical result. The interconnections can be programmed by addressing the appropriate bit lines and word lines, and transferring the desired programming data to the interconnections by applying to the selected word lines and bit lines a predetermined programming voltage.

For analog/multi-level Flash EEPROM, the cell $V_t$ is programmed with different levels, usually more than two levels. On the other hand, the prior art program algorithm used in some two-level devices is designed to have two levels only. Therefore, a new program algorithm needs to be developed.

The floating gate in Flash EEPROM devices may be charged through a Fowler-Nordheim tunneling mechanism by establishing a large positive voltage between the gate and source or drain. This causes electrons to be injected from the floating gate through the thin insulator. Alternatively, an avalanche injection mechanism, known as hot electron injection, may be used by applying potentials to induce high energy electrons in the channel of the cell which are injected across the insulator to the floating gate.

The high voltage used to charge the floating gate place significant design restrictions on flash EEPROM devices, particularly as the cell dimensions and process specifications are reduced in size.

The act of charging the floating gate using F-N tunneling mechanism is a relatively slow process that can restrict the application of flash EEPROM devices in certain speed sensitive application.

In prior art floating gate memory architectures using sub-micron technology, the critical dimension variation in patterns on the physical material is usually controlled within about 10%. For a flash EEPROM cell such variation in critical dimensions may result in a variation in programming speed to the second order. Further, if deviation in bias voltages in the array is considered, the variation in programming speed may vary by the fourth order in prior art devices.

Another problem associated with floating gate memory devices arises because the charging of the floating gate is difficult to control over a large array of cells. Thus, some of the cells program more quickly than others in the same device. In a given program operation, not all the cells subject of the operation will settle with the same amount of charges stored in the floating gate. Thus, so called program verify sequences have been developed to efficiently ensure that the memory is being accurately programmed. The program verify operations are based on comparing the data stored in the floating gate memory array with the intended data. The process of comparing data is relatively time consuming, involving sequencing byte by byte through the programmed cells. If a failure is detected in the verify sequence, then the program operation is retried. Program retries are typically executed word-by-word or byte-by-byte in prior art devices. Thus, bits successfully programmed in a byte with one failed bit are subject to the program cycle repeatedly. This can result in over-programming and failure of the cell. Also, when multiple bits per cell are stored, the program operations must be applied several times to establish the multiple threshold levels involved.

The conventional algorithm for programming a flash EEPROM uses a fixed pulse width and fixed bias voltages, with a program verification loop executed after each programming pulse. If the verifying fails, then another pulse is applied in an iterative fashion. In this stage, programming pulses with too much energy will produce over-programmed cells. An over-programmed cell may result in coding error by moving too much charge out of the floating gate. Thus, a good programming algorithm must be carefully designed to avoid over-programming, especially for multi-level devices where, as mentioned above, multi-level threshold voltages need to be programmed in narrow margin ranges. Another consideration for a good programming algorithm is to make sure that it does not take too long time to program a particular byte in the memory.

SUMMARY OF THE INVENTION

The present invention provides a new program algorithm and apparatus for analog/multi-level Flash EEPROM, which programs the cell $V_t$ with two or more different levels.

Accordingly, the present invention provides an algorithm and apparatus for programming a flash EEPROM array which ensures fast programming to substantially all of the cells in the array, without over-programming.

According to one aspect of the invention, the present invention provides an algorithm and apparatus for programming a flash memory array which ensures each cell in the array has a very small amount of threshold voltage program verification margin, which also ensures this small margin can be applied to all threshold levels.

The present invention is based on providing a pattern of program retry pulses which have respectively pulse widths and pulse heights which vary according to a pattern. The pattern includes a first stage which searches the program data-line voltage to ascertain that it is less than a first program verification margin and records a first data-line voltage for further program stages. At this stage, the algorithm includes applying certain number of first program pulses to the cell having a first pulse height and first pulse width with a first program speed. The algorithm also applies certain number of pulses to record the data-line voltage at this stage. Next, the algorithm uses the determined data-line voltages for each bit-line from the first stage and applies pulses with certain width until each cell has less than as second program verification margin which is also less than the first program verification margin. After each pulse, the algorithm determines whether the cell is programmed in response to the previous program pulse; and if not, applies a program retry pulse to the cell. After the program retry pulse, the algorithm determines whether the cell is programmed in response to that pulse, and if not, iteratively applies another program retry pulse to the cell and determines whether the cell is programmed until the cell is determined to be programmed within the second program verification margin or a maximum number of retries is made.

After the second stage, the algorithm uses the same data-line voltages for each bit-line and page program determined in the first stage and applies pulses with certain width which is narrower than the second pulse width used in the second stage until each cell has less than a third program verification margin which is also less than the second program verification margin. After each pulse, the algorithm determines whether the cell is programmed in response to the previous program pulse; and if not, applies a program retry pulse to the cell. After the program retry pulse, the algorithm determines whether the cell is programmed in response to that pulse, and if not, iteratively applies another program retry pulse to the cell and determines whether the cell is programmed until the cell is determined to be programmed within the third program verification margin or a maximum number of retries is made.

In this way, each threshold voltage $V_t$ for each cell can be programmed to the pre-determined value within a very small margin so that a multi-level status can be realized without over-programming while it ensures fast programming.

According to the one aspect of the invention, the multi-stage pulses in the pattern have respective energies determined by their respective pulse heights and pulse widths which are chosen to trade-off between the requirements of program time and programmed $V_t$ resolution. The underlying concept is to use pulse width resolution to control the resolution of programmed $V_t$.

According to another aspect of the invention, it can be characterized as a method for storing data in a memory array on an integrated circuit having a plurality of rows and columns of floating gate memory cells. Each cell has multi-level threshold voltages so that a multi-level digital or analog information can be stored in each cell. The method involves loading a page buffer on the integrated circuit with a row of input data (setting bits which are to receive program pulses to one of the program values) and selecting a row of memory cells for programming the input data to the row. The program pattern described above is applied the cells in the row of memory cells which correspond to input data having a program value in the page buffer. After each verify sequence, the input data for each bit which passes verify (that means that cell has a threshold voltage within a certain verification voltage margin) in the page buffer is reset to a do not program value. After resetting the bits in the page buffer which pass verify, the next pulse is applied only to cells which didn't pass.

The present invention is particularly useful for analog/multi-level flash EEPROM which requires a very tight margin for each voltage threshold $V_t$ in each memory cell.

Other aspects and advantages of the present invention can be seen upon review of the figures, the detailed description, and the claims which follow.

DETAILED DESCRIPTION

A detailed description of preferred embodiments of the present invention is provided with reference to the figures.

Figure 1:
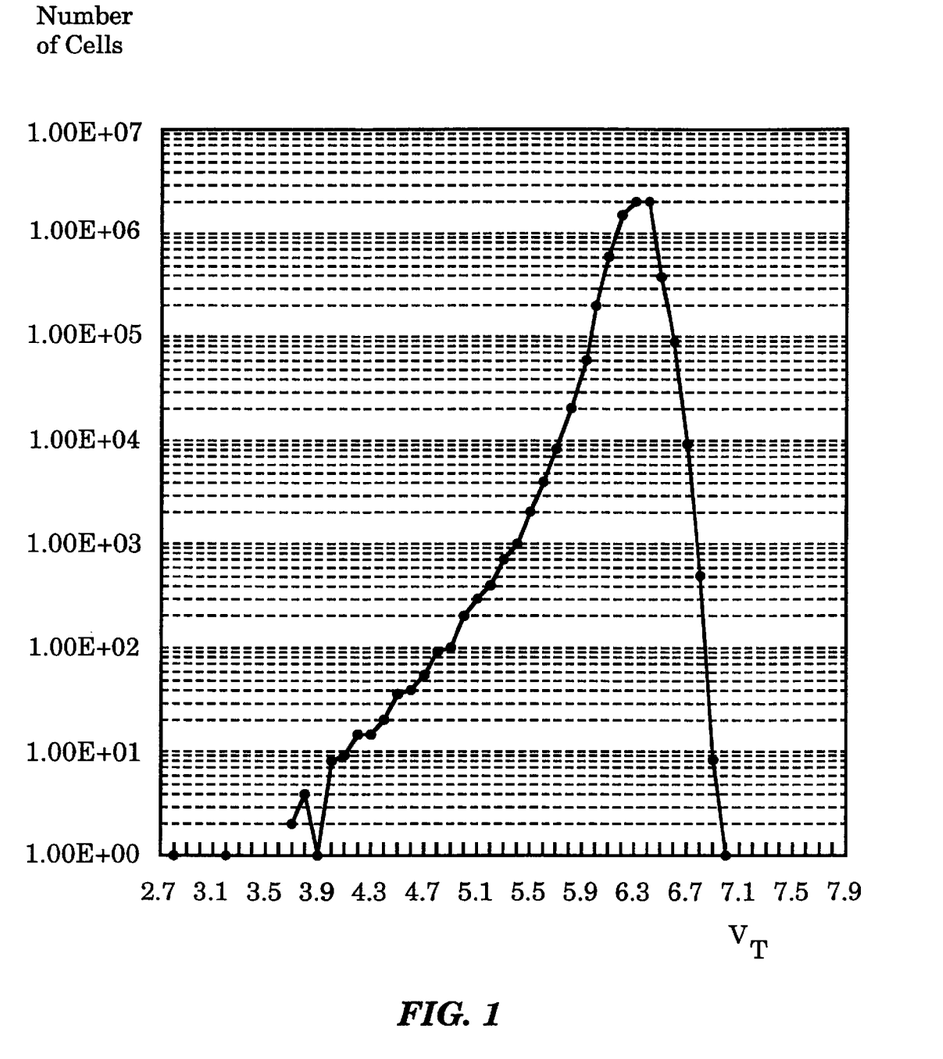
FIG. 1 shows the programmed cell $V_t$ distribution (Number of cells vs. voltage of the cells have) of an 16 M Flash EEPROM in DUMB-AUTCHKBD mode.

FIG. 1 shows the programmed $V_t$ distribution of 16 M Flash EEPROM by DUMB-AUTOCHKBD mode, where the cells are programmed simultaneously with the same data-line voltage, word-line voltage and the program time under each I/O basis (which means the program is done on 1 M bits basis, if only one I/O is chosen). From this, the prior art sub-micron Flash EEPROM process controllability can achieve about 5V programmed $V_t$ distribution width. A 5V programmed $V_t$ distribution width is far wider than the requirements for analog/multi-level flash EEPROM devices, even a two-level device. Therefore, a sophisticated program control has to be implemented to handle with this cell characteristic. The new program algorithm is proposed on this basis.

Figure 2:
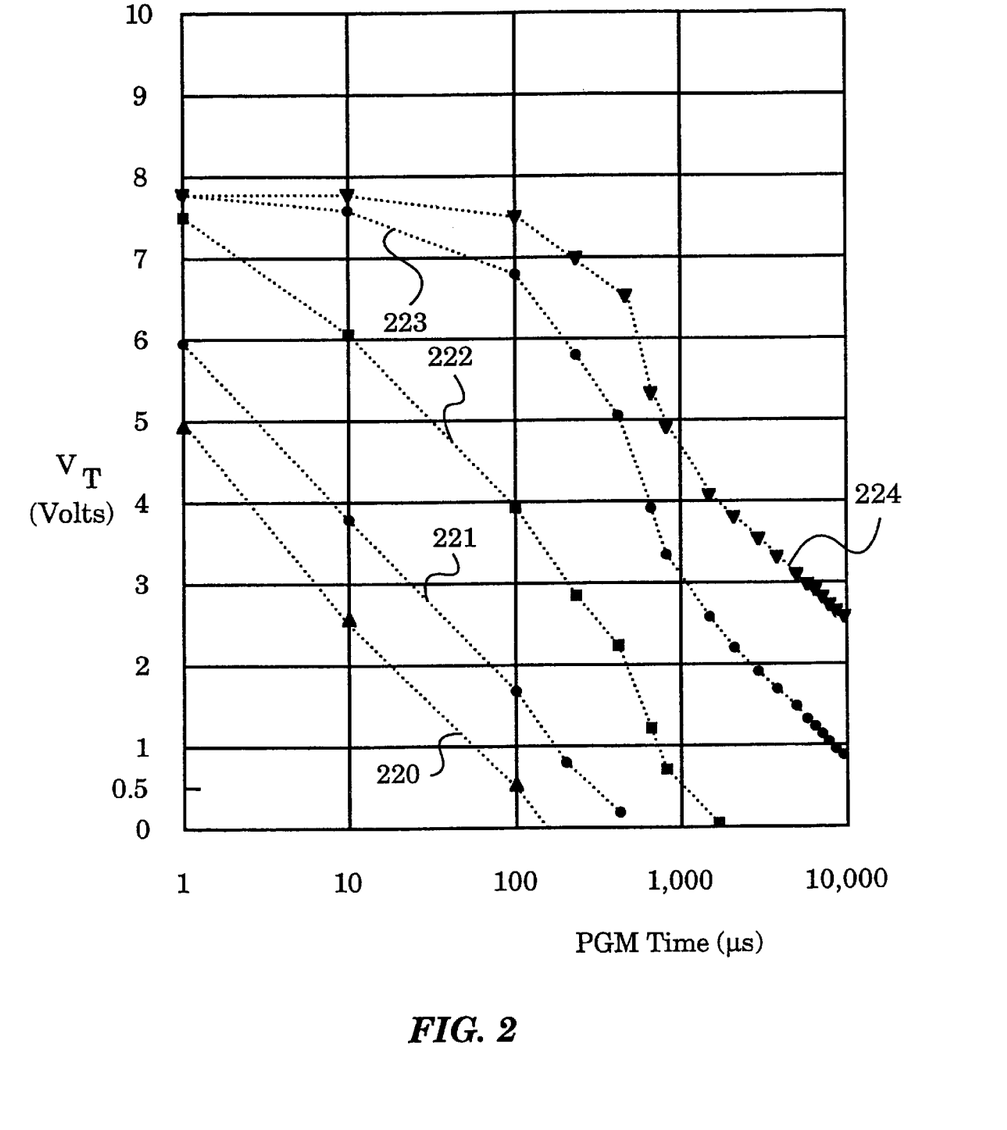
FIG. 2 is a graph illustrating the performance of a 2-level program which varies the pulse height and pulse width.
Figure 3:
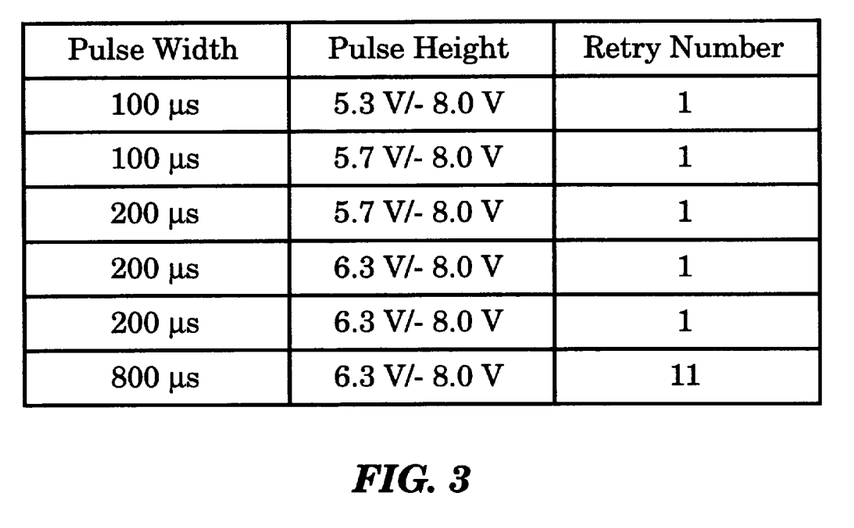
FIG. 3 shows the varied pulse height and pulse width.

FIG. 2 illustrates the improvement in performance provided by the controlled pulse width and pulse height for a 2-level Flash EEPROM device. The pulse width and pulse height pattern used has been selected so that the energies are roughly equivalent between the successive pulses. The pattern according to this embodiment is also shown in FIG. 3.

The horizontal axis in FIG. 2 provides program time on logarithmic scale in microseconds. The vertical axis shows resulting threshold voltage with a target threshold at 3 volts, and an over-program specification at 0.5 volts. Using the pattern shown in the table of FIG. 3, the fast cell on a fast circuit shown on trace 220 will not reach the over-program threshold after the first pulse. The fast cell shown on trace 221 will be significantly above the over-program threshold. The typical cell shown on trace 222 will not yet be programmed by the first 100 microsecond since the $V_t$ is still above 3 volts. However, after the second 100 microsecond pulse, the typical cell is programmed below the target $V_t$ of 3 volts but not over-programmed. The slow cell shown on trace 223 crosses the $V_t$ threshold of 3 volts very close to the 1,000 microsecond target. The slow cell with the slow circuit shown on trace 224 does not reach the target $V_t$ threshold until about 5,000 microseconds.

The varied pulse height and pulse width algorithm can be adjusted towards the needs of a particular implementation to improve the performance of a slow cell, and reduce the likelihood of over-programming while maintaining the average overall programming speed at an optimum value which is faster and easier to implement, and less likely to cause disturbance of neighboring cells than prior art systems.

Figure 5:
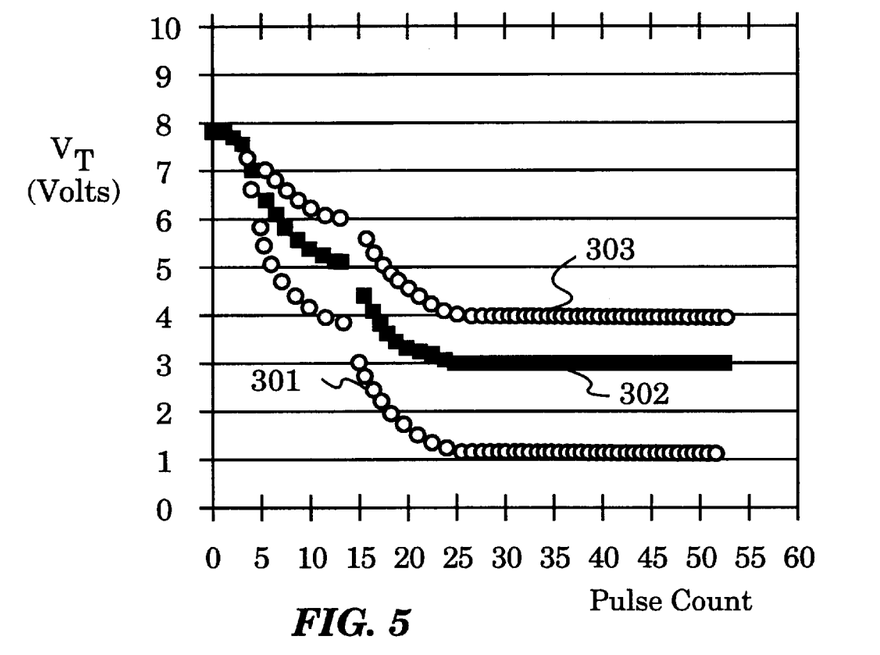
FIG. 5 shows the typical, fastest and slowest bit programmed $V_t$ time chart to target the medium, highest and lowest $V_t$, respectively, where the program bit-line/word-line voltages are varied according the proposed algorithm.

The proposed program control flow is listed below. The simulated $V_t$ vs. program time is shown in FIG. 5 where the typical, fastest and slowest bits are considered and are programmed to medium, highest and lowest target $V_t$, respectively. The pulse widths are chosen to trade-off between the requirements of program time and programmed $V_t$ resolution. The underline concept is to use the pulse width resolution to control the resolution of programmed $V_t$.

During page program, where the program word-line voltage is kept constant and each bit-latch is reset at each following program stage if the cell is program verified. Three stages (I, II, and III) are listed here respectively, I. To search the program data-line voltage to have less than 600 mV program verification margin for each data-line using 100 μs times 10 shots and 1 ms times 10 shots program pulse and record the data-line voltages for further program stage. Program speed ≈2 V/decade in time, 600 mV=2V/decade times $\log_{10}^2$ for another 100 μs pulse. The data-line voltage searching is not limited to the data line-power source voltage searching only. It can be extended to include any means to control the data-line voltage. For example, the pass gate gate-bias can control the output voltage. The analog data-line voltage record circuitry used in this stage can be as simple as a transistor and storage capacitance, if the capacitor leakage will not be too severe.

II. Use the data-line voltages determined in the stage I for each bit-line and page program using 100 μs pulses until each cell has less than 60 mV program verification margin. The maximum retry count is 10.

III. Use the data-line voltages determined in the stage I for each bit-line and page program using 10 μs pulses until each cell has less than 6 mV program verification margin. The maximum retry count is also 10.

FIGS. 5–9 are graphs illustrating the simulated results of performance improvements according to present invention.

Figure 4:
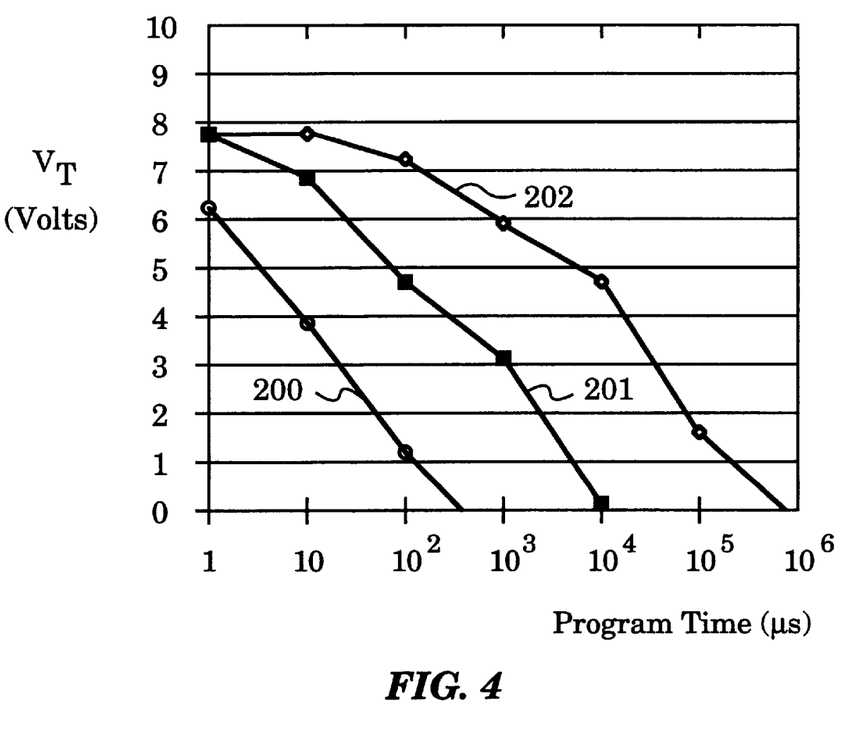
FIG. 4 shows the typical, fastest and slowest bit programmed $V_t$ time chart with different target programmed $V_t$, where the program bit-line/word-line voltages are constants.

FIG. 4 provides the typical, fastest and slowest bit programmed $V_t$ vs. time chart with different target programmed $V_t$, where the program bit-line/word-line voltage are constants. Along the horizontal axis is programming time in microseconds in logarithmic scale. Along the vertical axis is the resulting threshold voltage for the cell. The performance is charted for three cell conditions. The first cell condition shown on trace 200 is for a cell which programs quickly with normal bias. The second condition on trace 201 is provided for a typical cell in the array. The third condition on trace 202 illustrates the programming performance of a slow cell in the array. It can be seen that the fast cell results in much faster programming and more danger of over-programming than does the slower ones.

FIG. 5 shows the typical, fastest and slowest bit programmed $V_t$ vs. time chart to target the medium, highest and lowest $V_t$, respectively using the algorithm of this invention. It can be seen that with the new algorithm, three different kinds of cells mentioned in FIG. 4 (the fastest, typical and slowest) reach their different threshold voltages without any dangers of over-programming. The fastest cell 303 is programmed to the highest threshold voltage while the typical one is programmed to a typical threshold voltage and the slowest one is programmed to a lowest threshold voltage. The example shown on this figure is only for three-level devices. For multi-level devices, different cells with different programming speed will be programmed to different threshold voltages so that a multi-level/analog memory device can be realized.

Figure 6:
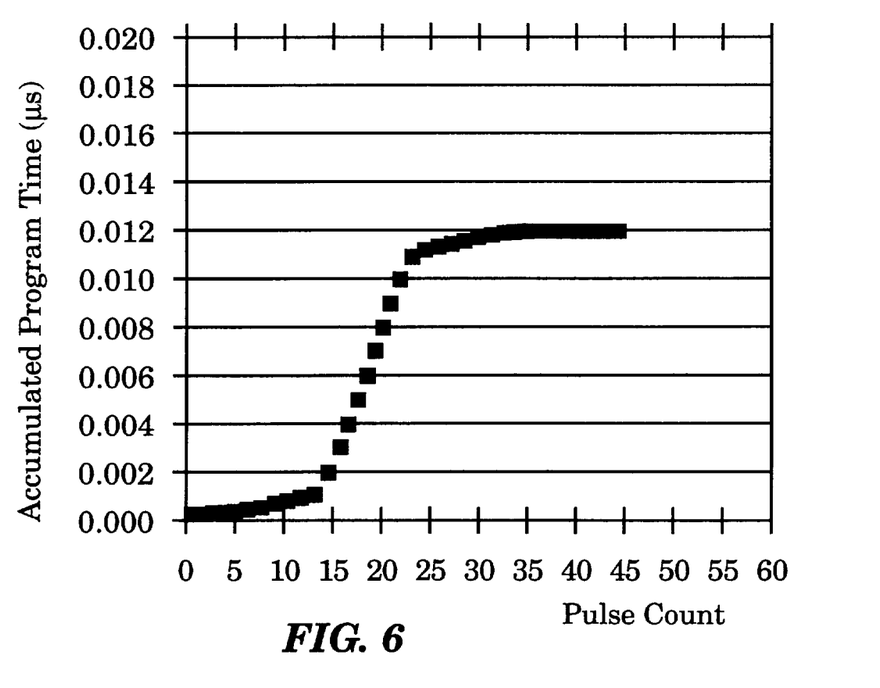
FIG. 6 shows the accumulated program time chart vs. pulse count.

FIG. 6 shows the accumulated program time chart vs. pulse count. The graph shows a three-stage procedure where pulse width are different to each other but keep the same within one stage as multi retries. The first stage uses pulse with short pulse width while the second stage uses pulses with longer pulse width and the third one also uses short pulse width.

Figure 7:
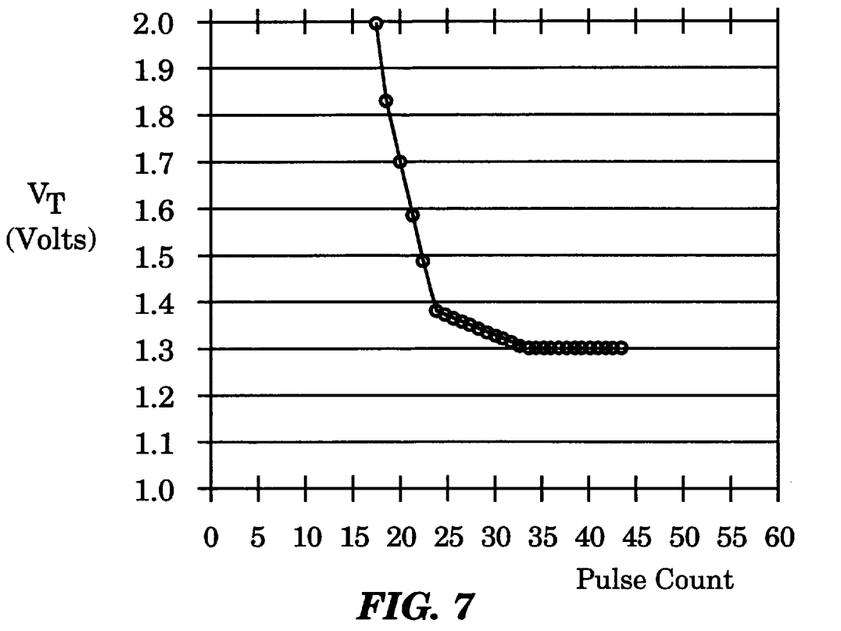
FIG. 7–9 show the slowest bit programmed $V_t$ time chart in the enlarged $V_t$ scale.
Figure 8:
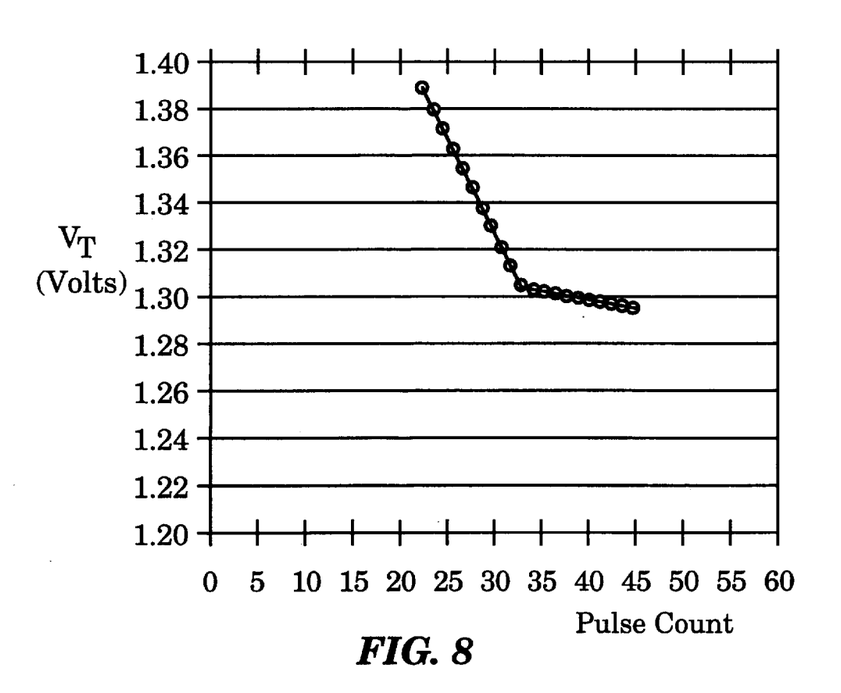
Figure 9:
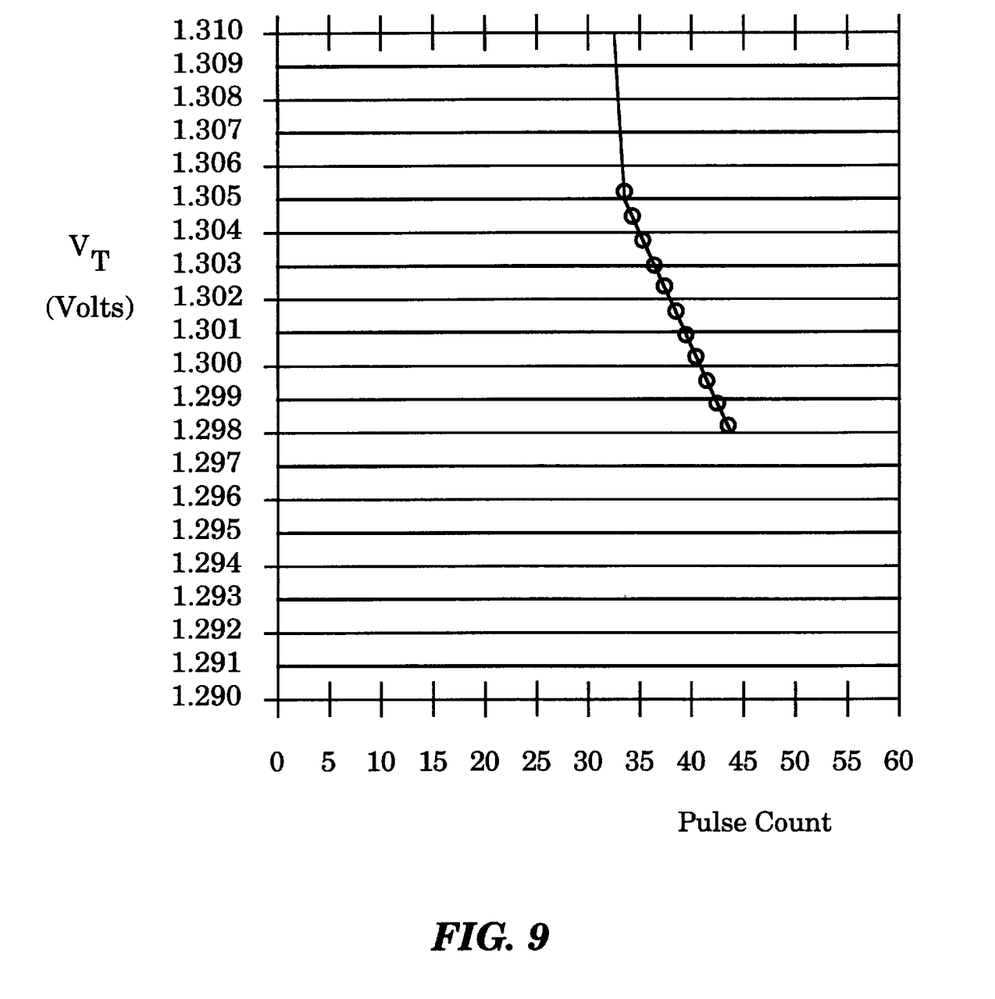

FIGS. 7–9 show of the slowest bit programmed $V_t$ time chart in the enlarged $V_t$ scale. The typical and fastest bit program $V_t$ behavior are similar to these. In FIG. 7, it can be seen that the algorithm can program the cell from 2.0 V to voltage within a range 1.4>V>1.2 within 5 pulses. In FIG. 8, it can be seen that the algorithm can program the cell from 1.40 V to voltage within a range 1.32>V>1.28 within 9 pulses. In FIG. 9, it can be seen that the algorithm can program the cell from 1.310 V to voltage within a range 1.298>V>1.296 within 10 pulses. If the target threshold voltage is set to 1.297 V and an over-program condition is considered about 0.001V in this example. With this threshold voltage margin, the present algorithm can program the said flash EEPROM device to multi-level/analog states easily within a very limited time period.

Figure 10:
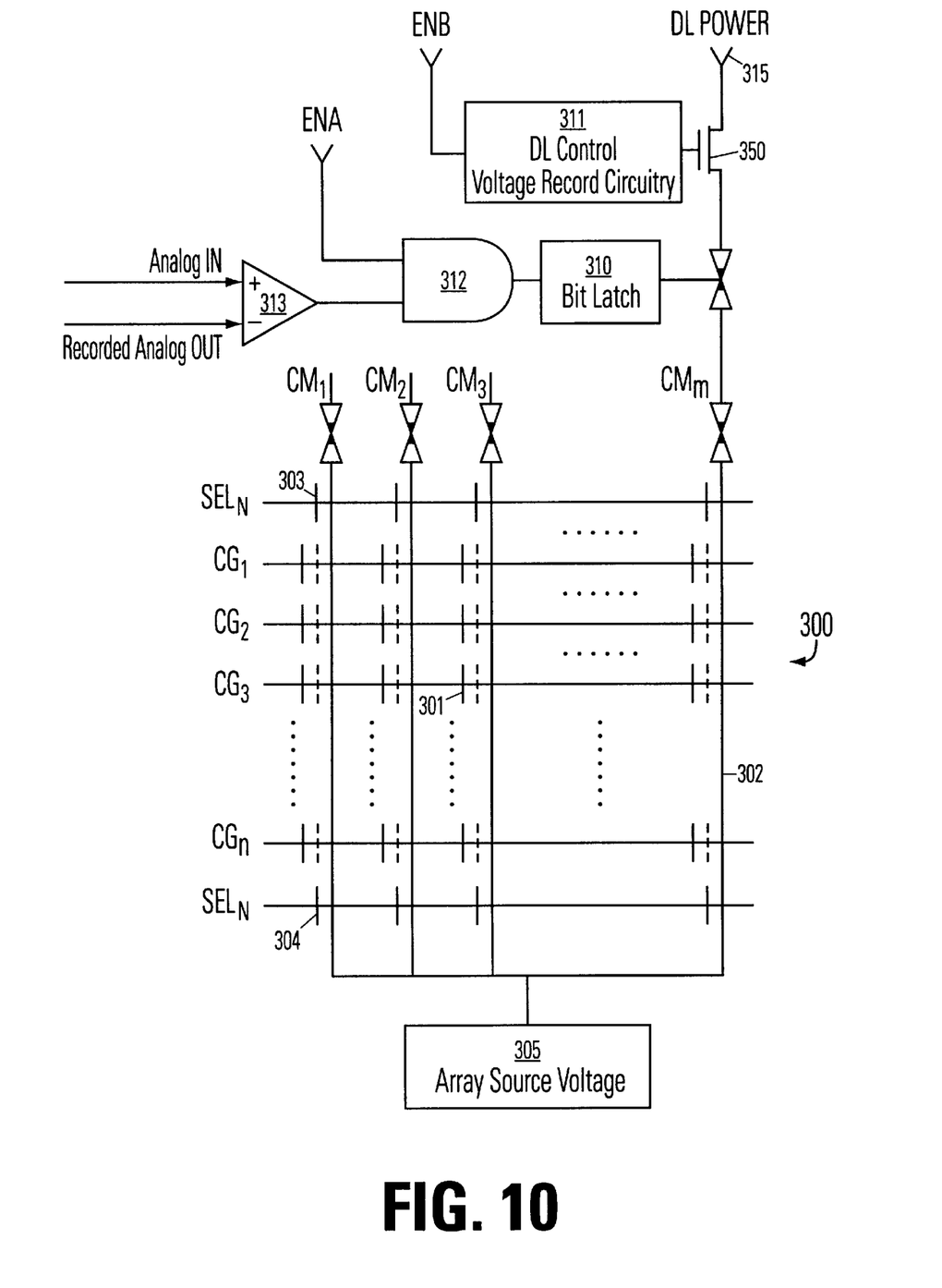
FIG. 10 is the diagram of the method of the invention for new program algorithm logic device.

To implement the above program algorithm, the realized embodiments have the analog data-line voltage record circuitry for each bit-line decoder and/or bit-latch as shown in FIG. 10. FIG. 10 shows the schematic to implement present invention. This embodiments also have the pulse width controllability from 10 μs to 1 ms. These embodiments should also have program verification voltage regulation for each program stage so that the said program algorithm can be implemented. Thus, as can be seen in FIG. 10 the multi-level device includes an array 300 of floating gate memory devices, represented in the figures by symbols similar to the element 301. The array 300 includes a plurality of bit lines, including bit line 302 which are coupled to respective bit line switches $CM_i$–$CM_m$, by which the bit lines in the array are coupled to the multi-level programming and sensing circuitry of the present invention. The array 300 also includes a plurality of word lines which are coupled to the control gates of the floating gate memory cell, the word lines being labeled $CG_1$–$CG_n$. The array 300 according to the preferred embodiment includes a plurality of sectors which are selectable using the select switches 303 and 304 for example in response to control signals $SEL_N$ for a particular sector. Also, an array source voltage source 305 is coupled to the bit lines through the select switches 304.

According to the present invention the control switch $CM_m$ is coupled to a bit latch 310 and to data line control voltage record circuitry 311. The bit latch 310 is controlled in part by the output of gate 312. The inputs to gate 312 include the signal ENA and the output of a comparator 313. The comparator receives at its inputs an analog input value representing the value to be programmed in a cell, and an analog output value by sensing the output of a cell being programmed. The comparator generates a logic high signal when the inputs match. The gate 312 is controlled by the control signal ENA. The control signal ENA is used to control the timing of resetting of the bit latch 310.

The data line control voltage record circuitry 311 has a control signal ENB supplied to it for the purpose of triggering the recording action of the data line control voltage record circuitry. For example, the circuitry 311 can be made by coupling a capacitor from the gate of pass transistor 350 to ground, and connecting a pass gate between the capacitor and a source of high voltage. The ENB signal is connected to the gate of the pass transistor to enable charge to flow into the capacitor. This records the voltage required to turn on the gate 350, which corresponds to the voltage on the data line. The voltage on the capacitor is used to control the data line voltage during programming.

Data line power is coupled to the bit line 302 at a level above the data line control voltage record circuitry 311, as indicated at point 315.

Accordingly, a new programming technique and new flash EEPROM cell and array which can store multiple bits in each cell have been provided. Also, the page program and verify circuitry provides efficient and accurate programming of the memory cells which can store multiple bits information in each cell. Thus, a high performance, reliable analog/multi-level flash EBPROM array can be achieved using these technologies.

Using the variable pulse width pulse pattern for program retries, substantially increase the performance of the flash EEPROM array. In particular, the target threshold voltages can be reached very precisely with a reduced over-programming, average programming time is increased, disturbance of unselected cells is limited, and fewer dye must be discarded because of too slow or too fast programming cells in the array.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for programming a multi-level floating gate memory cell, comprising the steps of:

searching a program data-line voltage of the cell and ascertaining that said program data-line voltage is less than a first program verification margin for each data-line of the cell by using a first number of program pulse shots having a first pulse width and a second number of program pulse shots having a second pulse width and recording the program data-line voltage of the cell;

using the recorded program data-line voltage for each bit-line and page programming the cell using a third number of program pulse shots having a third pulse width until the cell has less than a second program verification margin;

determining whether the cell is programmed within the second program verification margin; and if not iteratively applying another program retry pulse to the cell and determining whether the cell is programmed, until the cell is programmed within the second program verification margin or a maximum number, M, of retries is made;

using the recorded data-line voltage for each bit-line and page programming the cell using a fourth number of program pulses having a fourth pulse width until the cell has less than a third program verification margin;

determining whether the cell is programmed within the third program verification margin; and if not iteratively applying another program retry pulse to the cell and determining whether the cell is programmed, until the cell is programmed within the third program verification margin or a maximum number, N, of retries is made.

2. The method of claim 1, wherein the cell has a number of multi-level including two and greater than two.

3. The method of claim 1, wherein the first program verification margin is 600 mV.

4. The method of claim 1, wherein the first pulse width is 100 µs.

5. The method of claim 1, wherein the first number of shots is 10.

6. The method of claim 1, wherein the second pulse width is 1 ms.

7. The method of claim 1, wherein the second number of shots is 10.

8. The method of claim 1, wherein the third pulse width is 100 µs.

9. The method of claim 1, wherein the second program verification margin is 60 mV.

10. The method of claim 1, wherein M is 10.

11. The method of claim 1, wherein the fourth pulse width is 10 µs.

12. The method of claim 1, wherein the third program verification margin is 6 mV.

13. The method of claim 1, wherein N is 10.

14. The method of claim 1, wherein the first program verification margin is greater than the second program verification margin and the third program verification margin.

15. The method of claim 1, wherein the second program verification margin is greater than the third program verification margin.

16. The method of claim 1, wherein the cell has a control gate, a source and a drain, and the program pulses are generated by supplying a negative voltage to the control gate and a variable voltage to the drain, such that Fowler-Nordheim tunneling is induced to discharge the cell.

17. An apparatus having program circuits, coupled to a memory array, supply circuits and a plurality of bit latches for programming a cell on a selected word-line and on bit-lines coupled to a bit latch storing a program value, said apparatus comprising the following circuitry:

an analog data-line voltage record circuitry for each bit-line decoder and bit-latch;

a pulse width control means;

a program verification voltage regulating means for each program stage.

18. The apparatus of claim 17, wherein the program circuits have circuitry to program a multi-level floating gate memory cell, and to perform the steps of:

searching a program data-line voltage of the cell and ascertaining that said program data-line voltage is less than a first program verification margin for each data-line of the cell by using a first number of program pulse shots having a first pulse width and a second number of program pulse shots having a second pulse width and recording the program data-line voltage of the cell;

using the recorded program data-line voltage for each bit-line and page programming the cell using a third number of program pulse shots having a third pulse width until the cell has less than a second program verification margin;

determining whether the cell is programmed within the second program verification margin; and if not iteratively applying another program retry pulse to the cell and determining whether the cell is programmed, until the cell is programmed within the second program verification margin or a maximum number, M, of retries is made;

using the recorded data-line voltage for each bit-line and page programming the cell using a fourth number of program pulses having a fourth pulse width until the cell has less than a third program verification margin;

determining whether the cell is programmed within the third program verification margin; and if not iteratively applying another program retry pulse to the cell and determining whether the cell is programmed, until the cell is programmed within the third program verification margin or a maximum number, N, of retries is made.

19. The apparatus of claim 18, wherein the number for multi-level means two or more.

20. The apparatus of claim 18, wherein the first program verification margin is 600 mV.

21. The apparatus of claim 18, wherein the first pulse width is 100 $\mu$s.

22. The apparatus of claim 18, wherein the first number of shots is 10.

23. The apparatus of claim 18, wherein the second pulse width is 1 ms.

24. The apparatus of claim 18, wherein the second number of shots is 10.

25. The apparatus of claim 18, wherein the third pulse width is 100 $\mu$s.

26. The apparatus of claim 18, wherein the second program verification margin is 60 mV.

27. The apparatus of claim 18, wherein M is 10.

28. The apparatus of claim 18, wherein the fourth pulse width is 10 $\mu$s.

29. The apparatus of claim 18, wherein the third program verification margin is 6 mV.

30. The apparatus of claim 18, wherein N is 10.

31. The apparatus of claim 18, wherein the first program verification margin is greater than the second program verification margin and the third program verification margin.

32. The apparatus of claim 18, wherein the second program verification margin is greater than the third program verification margin.

33. The apparatus of claim 18, wherein the floating gate cell has a control gate, a source and a drain, and the program pulses are generated by supplying a negative voltage to the control gate and a variable voltage to the drain, such that Fowler-Nordheim tunneling is induced to discharge the floating gate cell.

* * * * *